United States Patent
Melanson

(10) Patent No.: US 8,009,077 B1
(45) Date of Patent: Aug. 30, 2011

(54) DELTA-SIGMA ANALOG-TO-DIGITAL CONVERTER (ADC) CIRCUIT WITH SELECTIVELY SWITCHED REFERENCE

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 171 days.

(21) Appl. No.: 12/564,182

(22) Filed: Sep. 22, 2009

Related U.S. Application Data

(60) Provisional application No. 61/185,042, filed on Jun. 8, 2009.

(51) Int. Cl.
 *H03M 1/12* (2006.01)
(52) U.S. Cl. ......................... 341/155; 341/143
(58) Field of Classification Search .................. 341/155, 341/172, 143
See application file for complete search history.

(56) References Cited

U.S. PATENT DOCUMENTS

| | | | |
|---|---|---|---|
| 4,227,185 A | 10/1980 | Kronlage | |
| 4,495,591 A | 1/1985 | Loomis, Jr. | |
| 4,599,573 A | 7/1986 | Senderowicz | |
| 4,887,085 A | 12/1989 | Moyal | |
| 4,896,155 A | 1/1990 | Craiglow | |
| 4,940,981 A | 7/1990 | Naylor et al. | |
| 4,972,189 A | 11/1990 | Polito et al. | |
| 4,972,436 A | 11/1990 | Halim et al. | |
| 4,999,632 A | 3/1991 | Parks | |
| 5,010,347 A | 4/1991 | Yukawa | |
| 5,012,178 A | 4/1991 | Weiss et al. | |
| 5,068,659 A | 11/1991 | Sakaguchi | |
| 5,079,550 A | 1/1992 | Sooch et al. | |
| 5,084,702 A | 1/1992 | Ribner | |
| 5,101,206 A | 3/1992 | Riedel | |
| 5,162,801 A | 11/1992 | Powell et al. | |
| 5,257,026 A | 10/1993 | Thompson et al. | |
| 5,274,375 A | 12/1993 | Thompson | |
| 5,351,050 A | 9/1994 | Thompson et al. | |
| 5,528,239 A | 6/1996 | Swanson et al. | |
| 5,621,406 A | 4/1997 | Goetzinger et al. | |
| 6,157,331 A | 12/2000 | Liu et al. | |
| 6,201,835 B1 * | 3/2001 | Wang | 375/247 |
| 6,498,573 B2 * | 12/2002 | Laaser | 341/143 |
| 2007/0013566 A1 * | 1/2007 | Chuang | 341/143 |

(Continued)

OTHER PUBLICATIONS

U.S. Appl. No. 12/366,214, filed Feb. 5, 2009, Schneider, et al.

(Continued)

*Primary Examiner* — Peguy JeanPierre
(74) *Attorney, Agent, or Firm* — Mitch Harris, Atty at Law, LLC; Andrew M. Harris

(57) ABSTRACT

A delta-sigma analog-to-digital converter (ADC) circuit improves performance by reducing the amount of noise and other error sampled by the reference switching circuit. The reference is operated such that one or more reference capacitors remain coupled to an input summing node of the ADC input integrator when an input value to a feedback digital-to-analog converter (DAC) indicates that their contribution is not required to apply a reference in the next quantization period. The reference switching network can select from two or more of the following reference options: 1) switch the reference capacitor to apply a charge quanta as per an ordinary switched-capacitor cycle, 2) switch the reference voltage on a second terminal of the reference capacitor to apply an opposite polarity charge quanta, or 3) leave the first terminal of the reference capacitor coupled to the integrator without changing the voltage at the second terminal of the reference capacitor.

20 Claims, 2 Drawing Sheets

U.S. PATENT DOCUMENTS

2010/0103014 A1* 4/2010 Quiquempoix et al. ...... 341/143

OTHER PUBLICATIONS

Yang, et al., "On-Line Adaptive Digital Correction of Dual-Quantisation Delta-Sigma Modulators", IET Electronics Letters, vol. 28, No. 16, pp. 1511-1513, Jul. 30, 1992, UK.

Paulos et al, "Improved Signal-to-Noise Ratio Using Tri-Level Delta-Sigma Modulation", IEEE Proc. ISCAS, May 1987, p. 463-466.

Adams et al, "Design and Implementation of an Audio 18-Bit Analog-to-Digital Converter Using Oversampling Techniques", Audio Eng. Soc., vol. 34, p. 156-266, Mar. 1986.

Hauser et al., "Circuit and Technology Considerations for MOS Delta-Sigma A/D Converters", IEEE Proc. ISCAS "86, p. 1310-1315, May 1986.

Larson et al., "Multibit Oversampled .SIGMA.-.DELTA. A/D Converter with Digital Error Correction", Electron. Lett., vol. 24, p. 1041-1052, Aug. 1998.

Carley, "A Noise-Shaping Coder Topology for 15+ Bit Converters", IEEE J. Solid-State Circuits, vol. SC-24, p. 267-273, Apr. 1989.

Abdennadher, et al., "Adaptive Self calibrating Delta-Sigma Modulators", Electronics Letters, Jul. 2, 1992, vol. 28, No. 14.

Yang et al., "On-Line Adaptive Digital Correction of Dual-Quantisation Delta-Sigma Modulators", Electronics Letters, Jul. 30, 1992, vol. 28, No. 16.

CS5542 Datasheet, Cirrus Logic, Sep. 1996, US.

CS5394 Datasheet, Cirrus Logic, May 1998, US.

* cited by examiner

US 8,009,077 B1

DELTA-SIGMA ANALOG-TO-DIGITAL CONVERTER (ADC) CIRCUIT WITH SELECTIVELY SWITCHED REFERENCE

This application Claims priority under 35 U.S.C. §119(e) to U.S. Provisional Patent Application Ser. No. 61/185,042 filed on Jun. 8, 2009.

BACKGROUND OF THE INVENTION

1. Field of the Invention

The present invention relates generally to analog-to-digital converters, and more specifically, to a delta-sigma analog-to-digital converter having a selectively switched reference.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

A delta-sigma modulator is constructed around an integrating circuit that integrates an input signal, and which is maintained in a stable operating range by application of a reference input, which provides a charge that cancels, on average, the charge applied by the input signal to the integrator. In switched-capacitor implementations of the ADC reference circuit, the reference charge is applied by a switched-capacitor network. A predominant source of noise in switched-capacitor delta-sigma ADCs is thermal noise sampled from the reference voltage. While a reference voltage can be made very low noise, the instantaneous thermal noise (and any other instantaneous error, such as high-frequency noise) present on the reference voltage is captured by the sampling switching network at the end of the reference sampling period. At that time the reference charge is captured on the reference sampling capacitor along with the instantaneous value of the noise and error, which is subsequently applied to the ADC integrator. Therefore, a full range of reference noise values (including peak noise values) can and will be present in the reference as applied to the ADC integrator.

The equivalent current noise due to switched capacitor sampling is governed by the following proportionality:

$$i_{eq}^2 \alpha 4kTCf_s\Delta f,$$

where $i_{eq}$ is the equivalent input current due to the switched-capacitor sampling, k is Boltzmann's constant, T is the absolute temperature, C is the capacitance of the sampling capacitor, $f_s$ is the sampling frequency, and $\Delta f$ is the bandwidth of interest. Because $i_{eq}^2$ depends on k, T and C, the sampled reference thermal noise is sometimes referred to as kTC noise. The impact of the above-described reference thermal noise sampling is that the overall reference noise and error level is directly proportional to the rate of switching of the reference.

Therefore, it would be desirable to provide a delta-sigma ADC that has a reduced amount of reference thermal noise and in general, reduces the error captured from the reference voltage.

SUMMARY OF THE INVENTION

The present invention includes an analog-to-digital converter (ADC) and its method of operation. The ADC selectively couples a terminal of a reference capacitor to a summing node of the input integrator depending on the output of the quantizer and/or the value at the input of the feedback digital-to-analog converter (DAC), and therefore reduces injected reference noise and reference error.

The ADC has a switched capacitor reference that is operated according to a value at the input of the feedback DAC. A next reference application can be determined from a previous feedback value according to patterns selected from among two or more of the following reference options: 1) switch the reference capacitor to apply a charge quanta as per an ordinary switched-capacitor cycle, 2) switch the reference voltage on a second terminal of the reference capacitor to apply an opposite polarity charge quanta, or 3) leave the first terminal of the reference capacitor coupled to the integrator summing node input without changing the voltage at the second terminal of the reference capacitor.

In multi-bit/multiple reference capacitor implementations, the selection from among the reference options can be made for the next quantization period to increase the average number of reference capacitors that remain coupled to the summing node input of the integrator, and the capacitors may be of unequal value, providing more flexibility in generating combinations that will increase that average.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus in the form of a delta-sigma type analog-to-digital converter (ADC) in which the impact of reference thermal noise is reduced by de-coupling one or more reference switching capacitors from the input summing node of the loop filter only when required to apply the feedback value. By leaving the reference switching capacitors connected to the input summing node except when absolutely necessary, the sampling of thermal noise and consequent injection of the thermal noise into the loop filter is avoided most of the time at most of the reference switching capacitors. A control logic determines the treatment of each individual reference capacitor in a next quantization period according to a value of the output of the quantizer of the ADC. The control logic selects from among two or more of the following reference application states for each reference capacitor according to the binary value provided from the quantizer output: 1) switch the reference capacitor to apply a charge quanta as per an ordinary switched-capacitor cycle, 2) switch the reference voltage on a second terminal of the reference capacitor to apply an opposite polarity charge quanta, or 3) leave the first terminal of the reference capacitor coupled to the integrator summing node input without changing the voltage at the second terminal of the reference capacitor.

Figure 1:
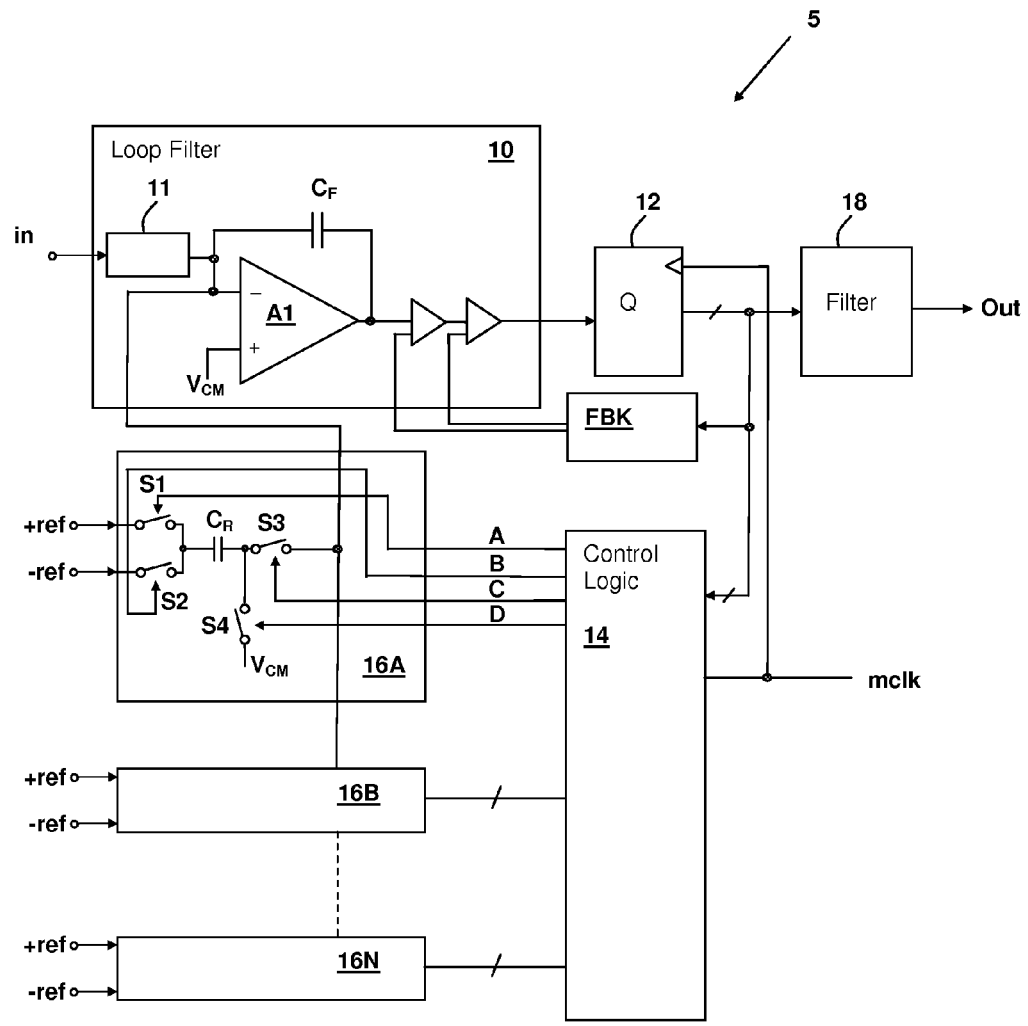
FIG. 1 is a block diagram depicting an ADC in accordance with an embodiment of the present invention.

Referring now to FIG. 1, an ADC 5 in accordance with an embodiment of the present invention is shown. An integrator forming the first stage of a loop filter 10, which is implemented in part by amplifier A1 and feedback capacitor $C_F$, integrates an input signal in provided from an input circuit 11. Input circuit 11 may be a switched-capacitor circuit or resistor if input signal in is a voltage signal, or input circuit 11 may be a direct coupling to the input summing node of amplifier A1 if input signal in is a current signal. The thermal noise reduction advantages of the present invention are especially applicable for current inputs to the summing node of amplifier A1, as no additional sampled thermal noise is added by input circuit 11 and no Boltzmann noise is added by an input resistor as is the case in a continuous-time voltage input configuration.

A quantizer 12 converts the analog output of loop filter 10 to a digital value, which is provided to a digital filter block 18 that decimates the output samples provided from quantizer 12 to generate output out of ADC 5.

A quantization clock signal mclk clocks the output of quantizer 12. Feedback is provided from the output of quantizer 12 by a feedback circuit FBK and a plurality of reference switched-capacitor circuits 16A-16N providing feedback to the first stage of loop filter 10. Feedback circuit FBK can be any form of digital-to-analog converter (DAC) suitable to provide feedback to subsequent stages of loop filter 11, but generally will be a switched-capacitor reference feedback circuit similar to those illustrated by reference switched-capacitor circuits 16A-16N. However, due to the gain of the first integrator stage within loop filter 10, the techniques of the present invention, which are incorporated in the control of reference switched-capacitor circuits 16A-16N, may be, but are not generally applied to circuits within feedback circuit FBK.

Reference switched-capacitor circuits 16A-16N are controlled by the digital output of quantizer 12 to apply feedback to a first integrator stage of loop filter 10 such that the average value of the output of quantizer 12 represents input signal in. The number of reference switched-capacitor circuits 16A-16N may differ for a given number of bits of the output of quantizer 12, depending on the specific embodiment implemented. For example, the number of reference switched-capacitor circuits 16A-16N may be equal to half the range of states of the output of quantizer 12 with an additional reference switched-capacitor circuit for any odd count of values. In the example, the configuration allows for the application of any value of the quantizer by selection from among two different reference polarities that may be applied to reference capacitor $C_R$. In another embodiment of the invention, the size of a reference capacitor $C_R$ within each of reference switched-capacitor circuits 16A-16N is set according to the weight of the corresponding bit of the output of quantizer 12. In such an exemplary configuration, one reference switched-capacitor circuit 16A-16N is provided for each bit of the output of quantizer 12. Other combinations of capacitor weights can be used for reference switched-capacitor circuits 16A-16N in order to reduce the occurrences of the same-state pattern.

A control logic 14 controls reference switched capacitor circuits 16A-16N according to an embodiment of the invention, so that the effect of thermal noise and reference error are reduced in the output of loop filter 10 and therefore ADC output Out. In a typical switched-capacitor ADC, the reference switched-capacitor circuits are operated at each quantization period to alternate the corresponding reference capacitors between a charging phase and a phase in which the reference charge is applied to the integrator. Each such cycle also applies the instantaneous value of the thermal noise that is captured on the corresponding reference capacitor as described above.

In contrast, ADC 5 selectively operates the individual reference switched-capacitor circuits 16A-16N in different modes selected for each quantization cycle to leave the corresponding reference capacitor $C_R$ connected to the summing node of amplifier A1 unless the required reference application for the corresponding reference capacitor $C_R$, requires that the particular one of reference switched-capacitor circuits 16A-16N be switched in a traditional manner. Such an event occurs when the same reference polarity is needed from the particular one of switched-capacitor circuits 16A-16N as was needed in the last non-zero feedback state for the particular one of switched-capacitor circuits 16A-16N. Further, in embodiments in which at least some of reference capacitors $C_R$ are of equal weight, the equal-weight capacitors are interchangeable, providing additional opportunity for control logic 14 to avoid the consecutive same-reference condition by exchanging the states assigned to the same-valued reference capacitors $C_R$. Reference capacitors $C_R$ that are used to apply the next reference quanta with a given reference polarity can be selected from those used to applying a quanta of an opposite polarity in a previous cycle (or last previous non-zero cycle), and therefore only when a reference capacitor $C_R$ leaving such a previous opposite polarity state is unavailable in a given cycle, will the operation of the corresponding reference switched-capacitor circuit 16A-16N require that the connection to the summing node of integrator A1 be interrupted.

In the illustrative embodiment of FIG. 1, control logic 14 controls reference switched capacitor circuit 16A, according to Table I below. The columns in Table I include the current cycle state State, the previous value of control signal A (Prev A), the clock phase (Phase) for each cycle state State, and the next state of control signals A, B, C and D.

TABLE I

| State | Prev A | Phase | A | B | C | D |
|---|---|---|---|---|---|---|
| − | 1 | 0 | 1 | 0 | 1 | 0 |
| − | 1 | 1 | 0 | 1 | 1 | 0 |
| + | 0 | 0 | 0 | 1 | 1 | 0 |
| + | 0 | 1 | 1 | 0 | 1 | 0 |
| 0 | 1 | d | 1 | 0 | 1 | 0 |
| 0 | 0 | d | 0 | 1 | 1 | 0 |
| − | 0 | Φ0 | 0 | 1 | 0 | 1 |
| − | 0 | Φ1 | 1 | 0 | 1 | 0 |
| + | 1 | Φ0 | 1 | 0 | 0 | 1 |
| + | 1 | Φ1 | 0 | 1 | 1 | 0 |

The next states of control signals A, B, C and D that close switches S1, S2, S3 and S4, respectively, are determined by control logic 14 from a next state selected from among + (positive reference), − (negative reference) or 0 (no change) and the previous reference voltage ref+, ref− selected by respective switches S1 and S2, i.e., the previous state of switch control signal A. As can be observed from Table I, the operation of switches S3 and S4 according to phases Φ0 and Φ1 of the quantization period is only performed when the next non-zero state has the same polarity as the previous state. Under all other conditions, the dependence on phases Φ0 and Φ1 is either "don't care" (d) and a constant switch state is asserted throughout the quantization period, or the input reference polarity is being changed without interrupting switch S3. Switching in the operating mode that changes polarity for a given reference capacitor $C_R$ is performed as shown for convenience of timing and circuit design, but the change polarity mode may, in other embodiments, apply the change in the states of control signals A and B at any point in the quantization period, including at the beginning of the quantization period, so that the dependence on phases Φ0 and Φ1 is also "don't care" when changing the polarity of the reference application.

If a zero state is applied for the next quantization cycle, then control signal C remains asserted, maintaining switch S3 in a closed state, preventing any sampling of thermal noise. Control signal D remains de-asserted, keeping switch S4 open. The reference voltage ref−, ref+ selected in the previous cycle generally remains selected in the zero state. If a state opposite the previous state is needed for feedback from reference switched capacitor circuit 16A, the states of control signals A and B are reversed at some point in the quantization period as described above, and remain asserted for the remainder of the quantization period, applying a charge quanta of opposite polarity to the summing node of amplifier A1. The selection from among same-state, no change and different state is a selection of operating modes of each of reference switched-capacitor circuits 16A-16N, in which the operating mode is selected for each of reference switched-capacitor circuits 16A-16N for each output value of quantizer 12, but is dependent on the previous state selected by a previous output value of quantizer 12, and also the states selected for other ones of reference switched-capacitor circuits 16A-16N, as will be described below.

If the polarity of the feedback applied by a given one of reference switched-capacitor circuits 16A-16N in the next quantization cycle requires the selected reference voltage ref+, ref− to provide the same polarity charge quanta as the last charge application, i.e., the most recent non-zero feedback selection for the given one of reference switched-capacitor circuits 16A-16N was the same, control signal C is first asserted to couple a first terminal of capacitor $C_R$ to a common-mode voltage $V_{CM}$, while the corresponding reference voltage ref+ or ref− is applied to the second terminal of capacitor $C_R$, activating control signal A to close switch S1 or activating control signal B to close switch S2. Under the above-described same-state operating mode, thermal noise is sampled when switch S3 is opened and applied to the summing node of amplifier A1 when switch S3 is subsequently closed. Control logic 14 is designed to receive the next feedback value provided by quantizer 12 and determine combinations of next states for each of reference switched-capacitor circuits 16A-16N, such that the overall number of same-state occurrences is minimized among the totality of reference switched-capacitor circuits 16A-16N. The above can be accomplished by using as many state-changed and zero-state selections as possible in a given combination before assigning any same-state selections.

Figure 2:
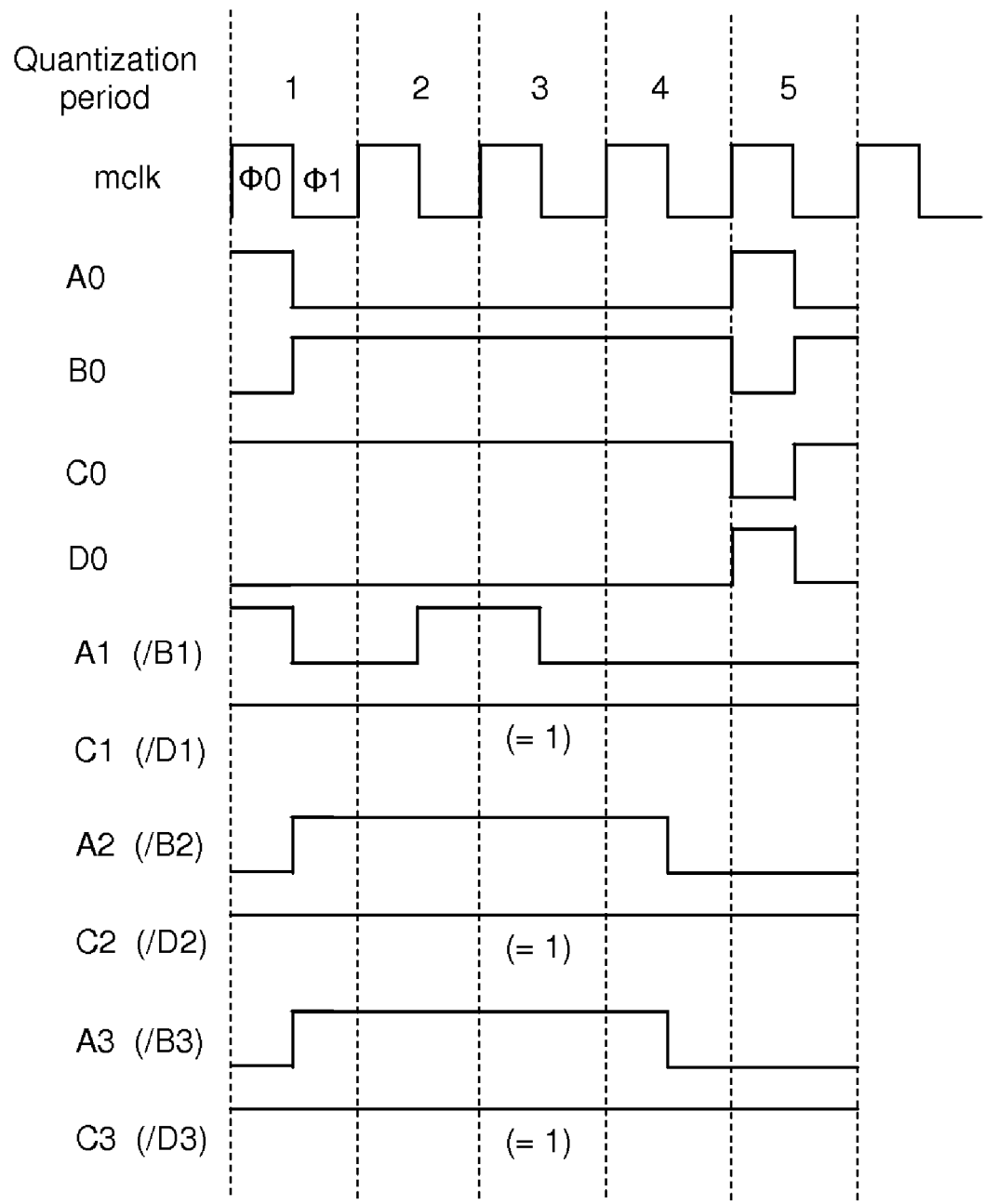
FIG. 2 is a signal waveform diagram depicting signal relationships within the circuit of FIG. 1.

Referring now to Table II below and further to FIG. 2, sequential operation of ADC 5 of FIG. 1 is illustrated. Capacitors $C_{R0}$-$C_{R4}$ represent four equal-valued reference capacitors $C_R$ each in a different one of reference switched-capacitor circuits 16A-16N of FIG. 1. (For example, capacitor $C_{R0}$ is in switched-capacitor circuit 16A, while capacitor $C_{R1}$ is in switched-capacitor circuit 16B, and so forth.) In FIG. 2, signals A0-D0 correspond to switch control signals A-D of FIG. 1, for switches associated with reference capacitor $C_{R0}$, and signals A1-D1 correspond to switch control signals associated with reference capacitor $C_{R1}$ and similarly for signals A2-D2 and A3-D3 corresponding to reference capacitors $C_{R2}$ and $C_{R3}$, respectively. For each of signal pairs A, B and C, D, in the illustrated example, signal B is an inverted version of signal A and signal D is an inverted version of signal C, although it is understood that for non-overlap requirements and other reasons, the actual switching signals employed will generally have timing that differs from that shown and all four of switch control signals A-D may be independent. In FIG. 2, signals A0 and B0 are illustrated separately, but signals A1-A3 are illustrated with signals B1-B3 understood to be inverted versions of depicted signals A1-A3. Similarly, for signals C1-C3 and D1-D3, only signals C1-C3 are illustrated, with signals D1-D3 understood to be inverted versions of signals C1-C3.

In Table II, a single + indicates that the selected input reference voltage is ref+ and the connection of reference capacitor $C_R$ to the input of amplifier A1 is not interrupted. Similarly, a single − indicates that the selected input reference voltage is ref− and the connection of reference capacitor $C_R$ to the input of amplifier A1 is not interrupted. An entry of +,G indicates that input reference voltage ref+ is selected to charge the reference capacitor $C_R$ and the other terminal of Capacitor $C_R$ is de-coupled from amplifier A1 and connected to $V_{CM}$. Similarly, an entry of −,I indicates that the first terminal of reference capacitor $C_R$ reference voltage ref− and the other terminal is coupled to the input of amplifier A1.

TABLE II

| Feedback value | 0 | | +1 | | −1 | | −2 | | −1 | |
|---|---|---|---|---|---|---|---|---|---|---|
| Clock Phase | Φ0 | Φ1 | Φ0 | Φ1 | Φ0 | Φ1 | Φ0 | Φ1 | Φ0 | Φ1 |
| $C_{R0}$ | + | − | − | − | − | − | − | − | +,G | −,I |
| $C_{R1}$ | + | − | − | + | + | − | − | − | − | − |
| $C_{R2}$ | − | + | + | + | + | + | + | − | − | − |
| $C_{R3}$ | − | + | + | + | + | + | + | − | − | − |

As illustrated, during the first quantization period, an equal and opposite change is applied using a first pair of capacitors $C_{R0},C_{R1}$, which have inputs that are changed from positive reference polarity to negative, and a second pair of capacitors $C_{R2},C_{R3}$, which have inputs that are changed from negative reference polarity to positive. Therefore, the net effect of the change applied using capacitors $C_{R0},C_{R1}$ and capacitors $C_{R2}$, $C_{R3}$, is that the equal and opposite changes cancel out, with a net effect of zero feedback applied to loop filter 10. In the second quantization period, a +1 feedback value is applied to the input of loop filter 10, by changing the reference selected at capacitor $C_{R1}$ from reference voltage ref− to reference voltage ref+. In the third quantization period, a −1 feedback value is applied to the input of loop filter 10, by changing the reference selected at capacitor $C_{R1}$ back to reference voltage ref−. In the fourth quantization period, a −2 feedback value is applied to the input of loop filter 10, by changing the reference voltage applied to capacitors $C_{R2},C_{R3}$ from reference voltage ref+ to reference voltage ref−. Up to this point, no sampling of thermal noise at the input of amplifier A1 has occurred, because switch S3 has remained closed during the first four quantization periods. During the fourth quantization period, a −1 feedback value cannot be applied without performing a traditional switching operation, so reference capacitor $C_{R0}$ is first connected between reference voltage ref+ and $V_{CM}$ and then between reference voltage ref− and the summing node input of amplifier A1.

While the invention has been particularly shown and described with reference to the preferred embodiments thereof, it will be understood by those skilled in the art that the foregoing and other changes in form and details may be made therein without departing from the spirit and scope of the invention.

What is claimed:
1. An analog-to-digital converter circuit, comprising:
   an integrator for receiving an input signal to be converted to a digital representation of the input signal;

a reference switched-capacitor circuit including a first switch for selectively coupling a first terminal of a reference capacitor to a summing node input of the integrator and a second switch for selectively coupling a second terminal of the reference capacitor to at least one reference voltage source, wherein the first switch and the second switch are operated by a switching clock;

a quantizer for generating a digital representation of the magnitude of the voltage of the output of the integrator; and a control circuit for controlling switching of the reference switched-capacitor circuit such that the first switch selectively couples the first terminal of the reference capacitor and the summing node input of the integrator depending on a first state of an output of the quantizer, whereby injection of thermal noise is reduced by leaving the first terminal of the reference capacitor coupled to the summing node input of the integrator during an entire quantization period of the quantizer.

2. The analog-to-digital converter of claim 1, wherein the control circuit opens and closes the first switch and the second switch during another quantization period of the quantizer to apply a reference charge to the summing node input of the integrator in response to a second state of the output of the quantizer.

3. The analog-to-digital converter of claim 2, wherein the at least one reference voltage source comprises multiple reference voltage sources, wherein the first switch and the second switch are operated according to one of three switching patterns selected in conformity with states of the output of the quantizer, wherein a first one of the switching patterns applies one of the reference voltage sources to the second terminal of the reference capacitor and the summing node input of the integrator to the first terminal of the capacitor during portions of a particular quantization period, wherein a second one of the switching patterns does not change a reference voltage source applied to the second terminal of the reference capacitor and couples the first terminal of the reference capacitor to the summing node input of the integrator during the entirety of the particular quantization period, and wherein a third one of the switching patterns couples the first terminal of the reference capacitor to the summing node input of the integrator during the entirety of the particular quantization period while coupling the second terminal of the reference capacitor to a different one of the reference voltage source than selected in a previous quantization period.

4. The analog-to-digital converter of claim 1, wherein the at least one reference voltage source comprises a first reference voltage source and a second reference voltage source, and wherein the control circuit alternatively couples the second terminal of the reference capacitor to the first reference voltage source during a previous quantization period of the quantizer and to the second reference voltage source in a next adjacent quantization period of the quantizer, and wherein the first terminal of the reference capacitor remains coupled to the summing node input of the integrator during the two adjacent quantization periods of the quantizer.

5. The analog-to-digital converter of claim 1, wherein the quantizer is a multi-bit quantizer and wherein the control circuit determines from a bit pattern of the output of the quantizer from an end of a previous quantization period whether to open the first switch during a next quantization period.

6. The analog-to-digital converter of claim 5, wherein the reference capacitor is one of a plurality of reference capacitors, and wherein the control circuit determines from the bit pattern of the output of the quantizer whether to selectively couple individual ones of the plurality of reference capacitors during the next quantization period, whereby a number of the reference capacitors that are uncoupled from the summing node input of the integrator during the next quantization period is minimized.

7. The analog-to-digital converter of claim 6, wherein the plurality of reference capacitors are selectively coupled to the input summing node of the integrator and further selectively coupled to one of multiple reference voltage sources or open-circuited during the next quantization period, according to the bit pattern of the output of the quantizer, and wherein the selective coupling is selected for each of the reference capacitors according to one of three switching states, a first switching state described by changing the reference voltage source to which each given reference capacitor is selectively coupled while leaving the given reference capacitor coupled to the input summing node of the integrator, a second switching state defined by leaving the given reference capacitor coupled to the input summing node of the integrator while not changing the reference voltage source to which the given reference capacitor is selectively coupled, or a third switching state defined by selectively coupling the given reference capacitor to the input summing mode of the integrator and to one of the reference voltage sources during corresponding portions of the next quantization period.

8. The analog-to-digital converter of claim 7, wherein the control circuit prioritizes selection as between the three switching states for each of the reference capacitors by minimizing occurrences of the third switching state in the next quantization period for the bit pattern of the quantizer output for the previous quantization period.

9. The analog-to-digital converter of claim 6, wherein the reference capacitors are of unequal capacitance.

10. An analog-to-digital converter circuit, comprising:
an integrator for receiving an input signal to be converted to a digital representation of the input signal;
a first reference switched capacitor circuit including a first reference capacitor having a first terminal connected to a summing node input of the integrator and a second terminal selectively coupled between multiple reference voltage sources;
a second reference switched capacitor circuit including a second reference capacitor having a first terminal selectively coupled to the summing node input of the integrator and a second terminal selectively coupled to at least one of the multiple reference voltage sources;
a quantizer for generating a digital representation of the magnitude of the voltage of the output of the integrator; and
a control circuit for controlling switching of the first reference switched-capacitor circuit and the second switched-capacitor circuit such that the first reference switched capacitor circuit changes the one of the multiple reference voltage source selectively coupled to the first reference capacitor and whether the second reference switched capacitor circuit is activated during a next quantization period depending on a state of an output of the quantizer in a previous quantization period.

11. An analog-to-digital converter circuit, comprising:
an integrator for receiving an input signal to be converted to a digital representation of the input signal;
a quantizer for generating a digital representation of the magnitude of the voltage of the output of the integrator; and
a switching circuit that determines a reference charge applied to the integrator during a next quantization period of the analog-to-digital converter circuit by a bit pattern of an output of the quantizer, wherein the switching circuit comprises multiple reference capacitors that can either be operated to transfer a first charge quanta from a single reference voltage source by selectively coupling a corresponding reference capacitor between the single reference voltage source and the summing node input of the integrator, transfer a second charge quanta by selecting between multiple reference voltage sources while the corresponding reference capacitor remains coupled to the summing node input of the integrator, or leaving the selective coupling of the corresponding reference capacitor unchanged from an end of the previous quantization period.

12. A method of converting an analog signal level to a digital output value, comprising:
continually integrating the analog signal level using an analog integrator;
quantizing a result of the integrating to provide the digital output value and a feedback value; and
applying at least one reference level selected by the feedback value using multiple switched capacitors, wherein the applying selectively disconnects the multiple switched capacitors from a summing node input of the analog integrator, whereby injection of thermal noise is reduced by leaving at least some of the multiple switched capacitors coupled to the summing node input of the integrator during an entire quantization period of the quantizing.

13. The method of claim 12, wherein the at least one reference level comprises multiple reference levels, wherein the multiple switched capacitors are selectively disconnected from the summing node input of the analog integrator according to one of three switching patterns selected in conformity with the feedback value for each of the multiple switched capacitors, wherein for each corresponding one of the multiple switched capacitors, a first one of the switching patterns applies one of multiple reference levels to the corresponding switched capacitors during a portion of a particular quantization period and applies the corresponding switched capacitor to the summing node input of the analog integrator during another portion of the particular quantization period, wherein a second one of the switching patterns does not change an applied one of the reference levels applied to the corresponding witched capacitor and couples the corresponding switched capacitor to the summing node input of the integrator during the entirety of the particular quantization period, and wherein a third one of the switching patterns couples the corresponding switched capacitor to the summing node input of the integrator during the entirety of the particular quantization period while changing the applied one of the reference levels to a different reference level than was selected in a previous quantization period.

14. The method of claim 12, wherein the at least one reference level comprises a first reference level and a second reference level, and wherein the control circuit alternatively couples the at least one switched capacitor to the first reference level during a previous quantization period of the quantizing and to the second reference level in a next adjacent quantization period of the quantizing, and wherein the first terminal of the switched capacitor remains coupled to the summing node input of the integrator during the two adjacent quantization periods of the quantizing.

15. The method of claim 12, wherein the result of the quantizing has multiple bits, and further comprising determining from a bit pattern of the result of the quantizing at an end of a previous quantization period whether to disconnect each of the multiple switched capacitors during a next quantization period.

16. The method of claim 15, wherein the determining determines a number of the reference capacitors that are uncoupled from the summing node input of the integrator, so that during the next quantization period the number is minimized.

17. The method of claim 16, wherein the applying selectively couples the multiple reference capacitors to the input summing node of the integrator and further selectively couples the multiple reference capacitors to one of multiple reference voltage sources or open-circuits the reference capacitor during the next quantization period, according to the bit pattern of the output of the quantizer, and wherein applying performs the selective coupling for each of the reference capacitors according to one of three switching states, a first switching state described by changing the reference voltage source to which each given reference capacitor is selectively coupled while leaving the given reference capacitor coupled to the input summing node of the integrator, a second switching state defined by leaving the given reference capacitor coupled to the input summing node of the integrator while not changing the reference voltage source to which the given reference capacitor is selectively coupled, or a third switching state defined by selectively coupling the given reference capacitor to the input summing mode of the integrator and to one of the reference voltage sources during corresponding portions of the next quantization period.

18. The method of claim 17, wherein the applying circuit prioritizes selection as between the three switching states for each of the reference capacitors by minimizing occurrences of the third switching state in the next quantization period for the bit pattern of the result of the quantizing for the previous quantization period.

19. The method of claim 16, wherein the reference capacitors are of unequal capacitance.

20. The method of claim 12, wherein the reference capacitors are of unequal capacitance.

* * * * *